United States Patent
Nakano et al.

(10) Patent No.: US 7,411,294 B2
(45) Date of Patent: Aug. 12, 2008

(54) DISPLAY DEVICE HAVING MISALIGNMENT DETECTION PATTERN FOR DETECTING MISALIGNMENT BETWEEN CONDUCTIVE LAYER AND INSULATING LAYER

(75) Inventors: Yasushi Nakano, Tokyo (JP); Shinsaku Chiba, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 12 days.

(21) Appl. No.: 11/095,603

(22) Filed: Apr. 1, 2005

(65) Prior Publication Data

US 2005/0230851 A1    Oct. 20, 2005

(30) Foreign Application Priority Data

Apr. 14, 2004   (JP)   ............... 2004-119297

(51) Int. Cl.
G02F 1/13     (2006.01)
H01L 23/48    (2006.01)
H05K 1/02     (2006.01)

(52) U.S. Cl. ............... 257/728; 257/E27.111; 257/E29.151; 257/E23.179; 257/E23.011; 257/E25.013; 257/784; 257/775; 257/776; 257/774; 257/773; 257/620; 257/797; 257/48; 257/66; 257/779

(58) Field of Classification Search ............ 257/728, 257/784, 779, 774, 773, 775, 776, 680, 48, 257/797, 620, 66, E27.111, E29.151, E23.011, 257/E25.013; 438/617

See application file for complete search history.

(56) References Cited

U.S. PATENT DOCUMENTS

| | | | |
|---|---|---|---|
| 6,441,497 B1 * | 8/2002 | Han .................... | 257/777 |
| 6,744,512 B2 * | 6/2004 | Takahashi .............. | 356/401 |
| 6,919,934 B2 * | 7/2005 | Ha et al. ............... | 349/43 |
| 7,030,961 B2 * | 4/2006 | Den Boef et al. ....... | 355/53 |
| 7,033,903 B2 * | 4/2006 | Lin et al. .............. | 438/377 |
| 7,096,911 B2 * | 8/2006 | Hashizume et al. ..... | 156/358 |
| 2001/0023918 A1 * | 9/2001 | Kondo ................ | 250/201.2 |
| 2001/0048145 A1 * | 12/2001 | Takeuchi et al. ....... | 257/620 |
| 2006/0201424 A1 * | 9/2006 | Hashizume et al. ..... | 118/712 |
| 2006/0284319 A1 * | 12/2006 | Jiang ................. | 257/777 |

* cited by examiner

Primary Examiner—Alexander O Williams
(74) Attorney, Agent, or Firm—Reed Smith LLP; Stanley P. Fisher, Esq.; Juan Carlos A. Marquez, Esq.

(57) ABSTRACT

A display device includes a display panel, and the circuit substrate is separately formed and positioned different from the array substrate of the display panel and connected to the display panel. The circuit substrate includes an insulating substrate, a conductive layer, an insulating layer to cover a part of the conductive layer, a plating layer applied to a portion of the conductive layer which is exposed from the insulating layer due to misalignment between the conductive layer and the insulating layer, and a misalignment detection pattern for detecting the misalignment between the conductive layer and the insulating layer. The misalignment detection pattern has a pattern covered by the insulating layer in a manner to prevent adherence of a plating material to the conductive layer, if the misalignment between the conductive layer and the insulating layer is smaller than a predetermined misalignment tolerance.

25 Claims, 7 Drawing Sheets

DISPLAY DEVICE HAVING MISALIGNMENT DETECTION PATTERN FOR DETECTING MISALIGNMENT BETWEEN CONDUCTIVE LAYER AND INSULATING LAYER

The present application claims priority from Japanese application JP2004-119297 filed on Apr. 14, 2004, the content of which is hereby incorporated by reference into this application.

BACKGROUND OF THE INVENTION

The present invention relates to a display device, and more particular, to a display device making use of a flat-surface type display panel, and is suited to a circuit substrate that supplies a signal and a voltage required for driving of a display panel.

Display devices of various types such as liquid crystal display devices making use of a liquid crystal panel as a display panel, which constitutes a highly-accurate flat-surface type display device capable of color display for portable telephones, note-sized computers, or display monitors, organic electroluminescence display devices (organic EL display devices), field emission type display devices (FED), plasma display devices, or the like have already come into practical use, or are in the study phase of commercial application.

In particular, high accuracy and lightening are greatly demanded of display devices used for portable telephones in recent years. Display devices of this type propagate as a display module, in which a backlight, a drive circuit, a peripheral circuit, etc. are incorporated into a display panel such as liquid crystal panel, etc. In, for example, display modules for portable telephones, various signals and voltages for display are supplied to a drive circuit chip, which is mounted on a substrate of a display panel, from a signal processing circuit substrate with the use of a flexible printed circuit substrate (FPC). In addition, while the invention is not limited to FPC but is also applicable to a so-called printed circuit substrate, it is described here taking a FPC as a typical example.

Such circuit substrates called FPC mount solder mounted parts such as resistors, capacitors, etc. and comprise an insulating substrate made of base film, a conductive layer of copper or the like to constitute a wiring pattern, an insulating layer to cover a part of the conductive layer, and a plating layer applied to that portion of the conductive layer, which is exposed from the insulating layer. Solder resist (insulating layer), which serves to avoid adherence of a plating layer to portions except a necessary conductive layer, is coated or stuck to a region, in which solder mounted parts are mounted. An opening is formed in the solder resist and terminals of parts being mounted are solder-connected to wiring terminals exposed from the opening.

Figure 12A:
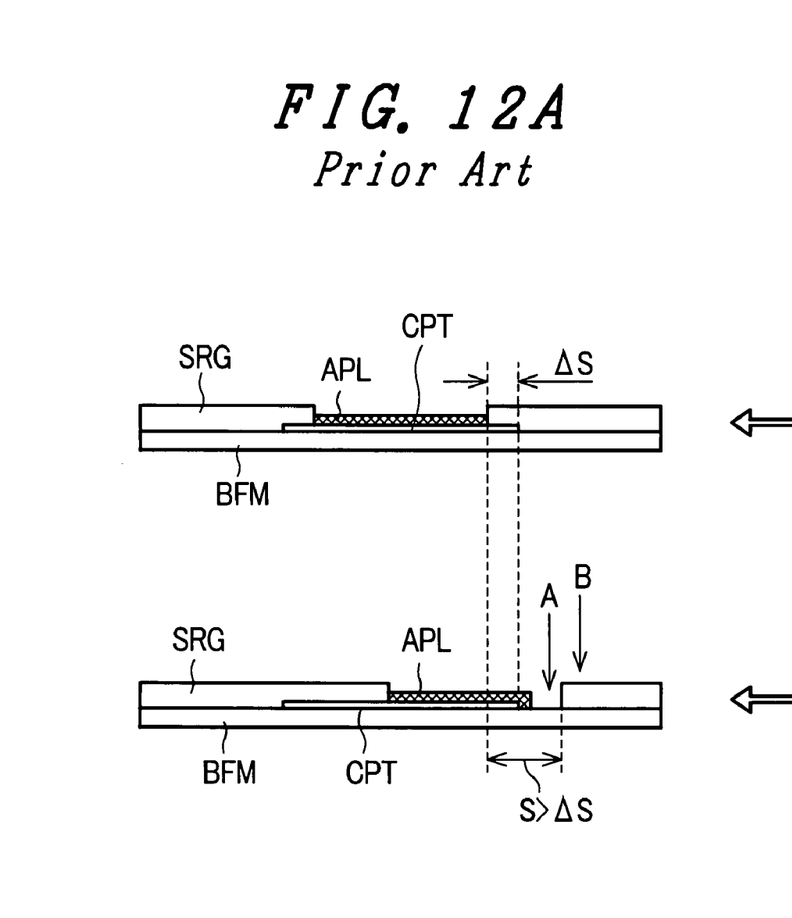
FIGS. 12A and 12B are views illustrating misalignment between an opening of solder resist and a conductive layer in a conventional FPC.
Figure 12B:
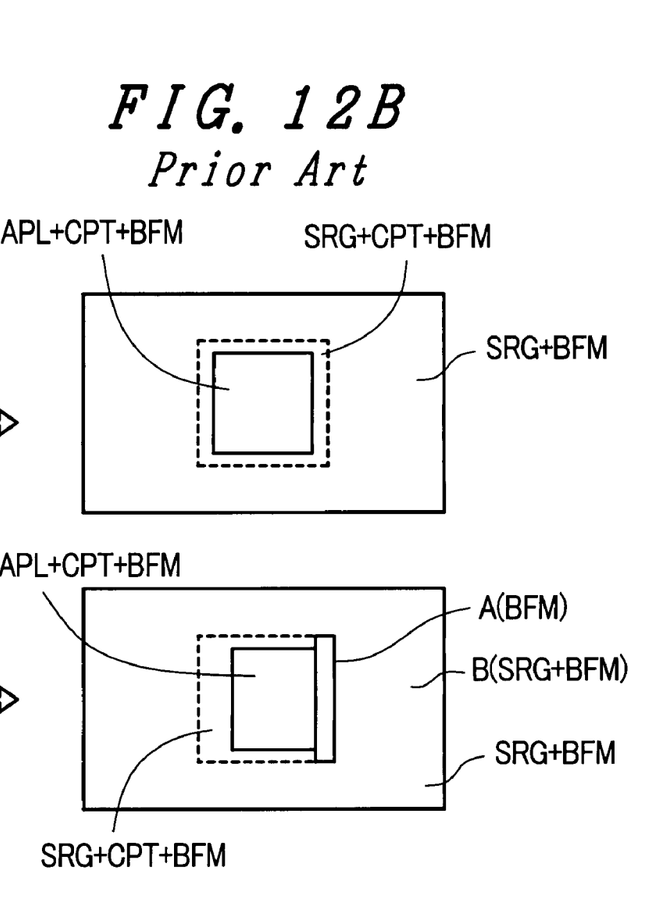

FIGS. 12A and 12B are views illustrating misalignment between an opening of solder resist and a conductive layer in a conventional FPC, FIG. 12A being a cross sectional view, and FIG. 12B being a plan view. In FIGS. 12A and 12B, upper sections illustrate the case where there is no misalignment between an opening of solder resist and a conductive layer, and lower sections illustrate the case where there is misalignment between the opening of the solder resist SRG and the conductive layer. In FIGS. 12A and 12B, a FPC comprises an insulating substrate BFM made of a base film, a conductive layer (a wiring pattern of copper) CPT, solder resist SRG being an insulating layer to cover a part of the conductive layer CPT, and a gold plating layer APL applied to that portion of the conductive layer CPT, which is exposed from the solder resist SRG. FIG. 12A shows a laminated state of the elements, and FIG. 12B shows an opening of the solder resist SRG and a state of misalignment in a plane of the opening.

In the case where there is no misalignment between the opening of the solder resist and the conductive layer, the gold plating layer APL is correctly formed on the conductive layer (a wiring pattern of copper) CPT within the opening of the solder resist, as shown in the upper sections of FIGS. 12A and 12B. In contrast, in the case where there is misalignment S of at least $\Delta S$ between the opening of the solder resist and the conductive layer, there comes out a state, in which the gold plating layer APL formed on the conductive layer (a wiring pattern of copper) CPT becomes narrow within the opening of the solder resist SRG and the insulating substrate BFM made of a base film is exposed to a A region, as shown in the lower sections of FIGS. 12A and 12B. When electronic parts are mounted in such state, there occurs a state, in which terminals of the electronic parts are not connected normally to the gold plating layer APL formed on the conductive layer CPT.

Shift of an opening of solder resist formed on a FPC from a normal position is prescribed to be, for example, at most 0.1 mm while being according to a degree of minuteness of a wiring pattern. Conventionally, an amount of misalignment of a solder resist opening is visually inspected with the use of a microscope of about 10 magnifications.

SUMMARY OF THE INVENTION

In case of using polyimide as a base film for a lower-layered insulating substrate, both its body color and a body color of solder resist are of the same family color (yellow translucent color), so that it is hard to decide a boundary between the both and it is difficult to ascertain misalignment and to measure an amount of misalignment, thus bringing about a possibility that misalignment is recognized to be too small. In the case where solder resist is substantially colorless and transparent, it is likewise difficult to decide a boundary between the both. When misalignment of a solder resist opening is underestimated in this manner, there is incurred failure in mounting of electronic parts, so that there is caused degradation in indicated quality.

The invention has an advantage that it is possible to provide a display device of high display quality having a circuit substrate, on which electronic parts are correctly mounted in a manner to afford visually recognizing presence and absence of misalignment of a solder resist opening with ease even when a body color of solder resist and a body color of insulating substrate are of the same family.

The advantage can be achieved by providing a misalignment detection pattern on a circuit substrate such as FPC, etc. and composing the misalignment detection pattern from a conductive layer for detection of misalignment, formed simultaneously from the same material as that of a conductive layer used for wiring and terminals, and an insulating layer, which covers the conductive layer for detection of misalignment with a predetermined misalignment tolerance $\Delta S$ from an edge of the conductive layer for detection of misalignment in a manner to prevent a plating material from adhering to the conductive layer for detection of misalignment.

When a pattern of the conductive layer and solder resist are shifted at least a predetermined misalignment tolerance $\Delta S$ from each other, the conductive layer for detection of misalignment, which amounts to a magnitude beyond the predetermined misalignment tolerance $\Delta S$, is exposed from the solder resist. Plating (usually, gold plating) adheres to a region on the conductive layer for detection of misalignment, which amounts to a magnitude beyond the predetermined distance ΔS, in a post-process. When misalignment is less than the predetermined distance ΔS, there is no adherence of plating. Thereby, misalignment between the pattern of the conductive layer and an opening of solder resist is judged on the basis of presence and absence of plating, of which visibility is high, and a magnitude of misalignment is made easy to measure.

A typical constitution of the invention is as follows. That is, a display device of the invention comprises (1) a display panel and a circuit substrate connected to the display panel. The circuit substrate comprises an insulating substrate, a conductive layer, an insulating layer to cover a part of the conductive layer, a plating layer applied to that portion of the conductive layer, which is exposed from the insulating layer, and a misalignment detection pattern for detection of misalignment between the conductive layer and the insulating layer. The misalignment detection pattern comprises a pattern covered by the insulating layer in a manner to prevent adherence of a plating material to the conductive layer.

(2) In (1), the misalignment detection pattern comprises an opening formed on the insulating layer to allow the insulating substrate to be exposed, and the conductive layer formed distant a predetermined distance from the opening to surround the opening and covered by the insulating layer.

(3) In (2), the conductive layer surrounding the opening of the misalignment detection pattern comprises a pattern itself, which is unitarily continuous.

(4) In (2), the conductive layer surrounding the opening of the misalignment detection pattern comprises a plurality of discrete patterns.

(5) In (1), the misalignment detection pattern comprises the conductive layer formed to be island-shaped, and the insulating layer formed to be island-shaped to cover the island-shaped conductive layer.

(6) In (1), the conductive layer of the misalignment detection pattern is supplied with a predetermined potential.

(7) In (1), the conductive layer of the misalignment detection pattern is electrically floating.

(8) In any one of (1) to (7), the circuit substrate comprises a flexible printed circuit substrate.

(9) In any one of (1) to (8), an electronic part is mounted on that portion of the circuit substrate, on which the plating layer is formed.

In addition, the invention is not limited to the constitution described above and a constitution disclosed in embodiments described later but it goes without saying that various modifications can be made without departing from the technical thought of the invention.

According to the invention, a display device of high display quality can be provided by using such circuit substrate to constitute a display device.

BRIEF DESCRIPTION OF THE DRAWINGS

FIG. 4 is a view illustrating an example of a specific arrangement of misalignment detection patterns on a FPC;

DESCRIPTION OF THE PREFERRED EMBODIMENTS

Embodiments of a display device according to the invention will be described below in detail with reference to the drawings. In addition, while the following embodiments are described taking a liquid crystal display device as an example of the display device according to the invention, it goes without saying that they are applicable to other display devices such as organic EL display devices, FED, etc.

Embodiment 1

Figure 1A:
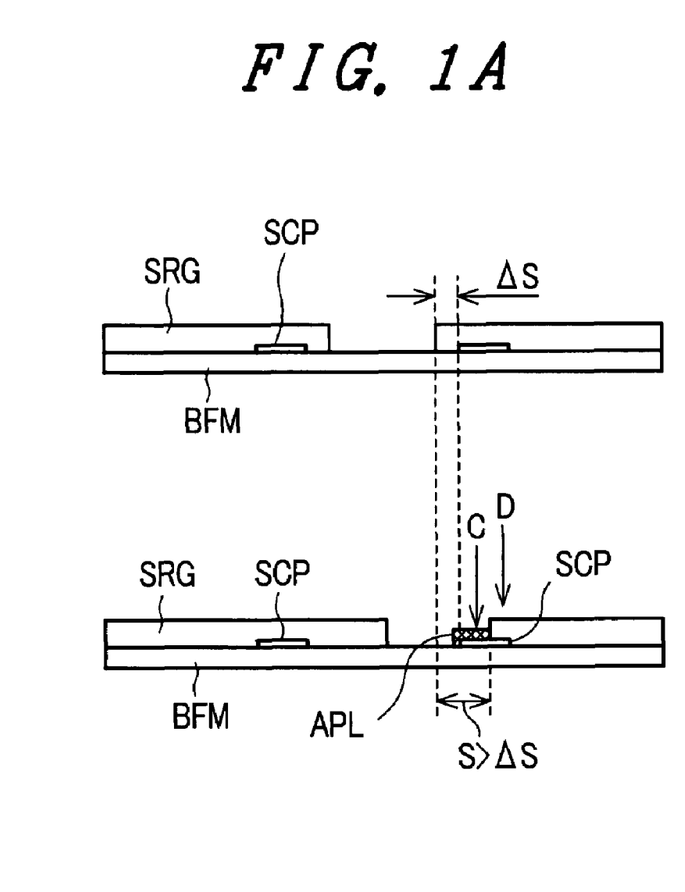
FIGS. 1A and 1B are views illustrating misalignment between an opening of solder resist and a conductive layer in a FPC according to an embodiment 1 of the invention.
Figure 1B:
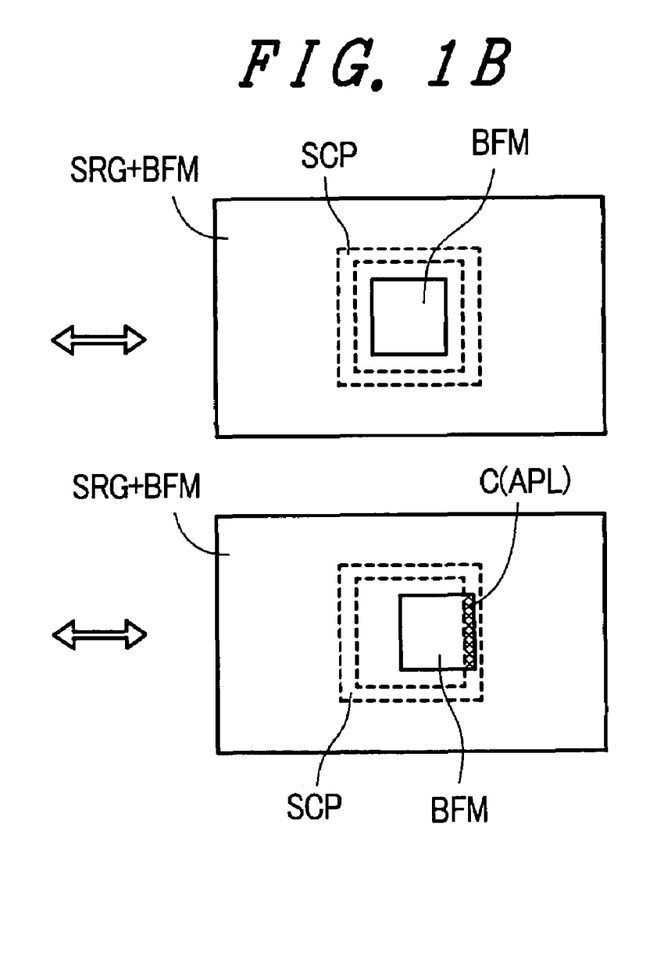

FIGS. 1A and 1B are views illustrating misalignment between an opening of solder resist and a conductive layer in a FPC according to an embodiment 1 of the invention, FIG. 1A being a cross sectional view, and FIG. 1B being a plan view. In FIGS. 1A and 1B, upper sections illustrate the case where there is misalignment less than a predetermined misalignment tolerance between the opening of the solder resist and the conductive layer, and lower sections illustrate the case where there is misalignment of at least the predetermined misalignment tolerance between the opening of the solder resist SRG and the conductive layer. In FIGS. 1A and 1B, the FPC comprises an insulating substrate BFM made of a base film, a misalignment detection pattern SCP formed from a conductive layer of copper (Cu), and solder resist SRG covering the misalignment detection pattern SCP and formed with an opening, to which the insulating substrate BFM is exposed. Illustration of a wiring pattern is omitted.

According to the present embodiment, the misalignment detection pattern SCP is in the form of a rectangular frame and is formed to surround the opening of the solder resist SRG. ΔS shown in the upper sections, when misalignment between the opening of the solder resist and the misalignment detection pattern SCP is less than a predetermined misalignment tolerance ΔS, plating is not formed on the misalignment detection pattern about the opening of the solder resist SRG through a gold plating processing in the subsequent process.

On the other hand, as shown in the lower sections, when an amount S of misalignment between the opening of the solder resist and the misalignment detection pattern SCP becomes at least the predetermined misalignment tolerance ΔS, the misalignment detection pattern SCP is exposed from the opening of the solder resist. Therefore, when going through a gold plating processing in the subsequent process, gold plating APL is formed on the misalignment detection pattern SCP exposed from the opening of the solder resist SRG. Since there is a large difference in hue and brilliance between a C portion, to which the gold plating APL is applied, and the solder resist SRG in the vicinity thereof, or the substrate BFM, it is possible to visually recognize presence of misalignment between the both and an amount of misalignment with ease. Accordingly, such detection of misalignment can prevent a defective FPC from being used for products, thus enabling obtaining a display device of high quality and high reliability.

Figure 2A:
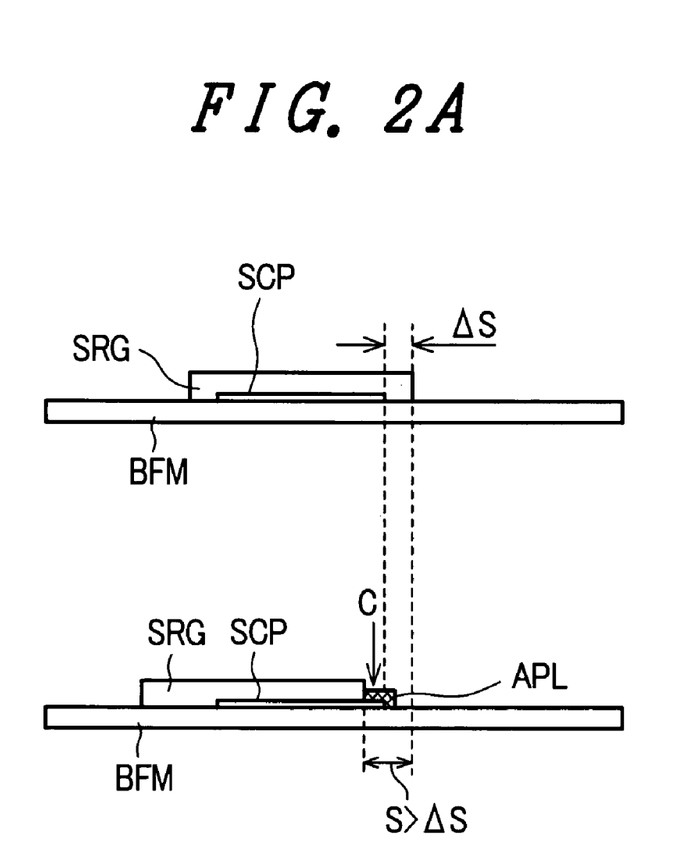
FIGS. 2A and 2B are views illustrating misalignment between an opening of solder resist and a conductive layer in a FPC according to an embodiment 2 of the invention.
Figure 2B:
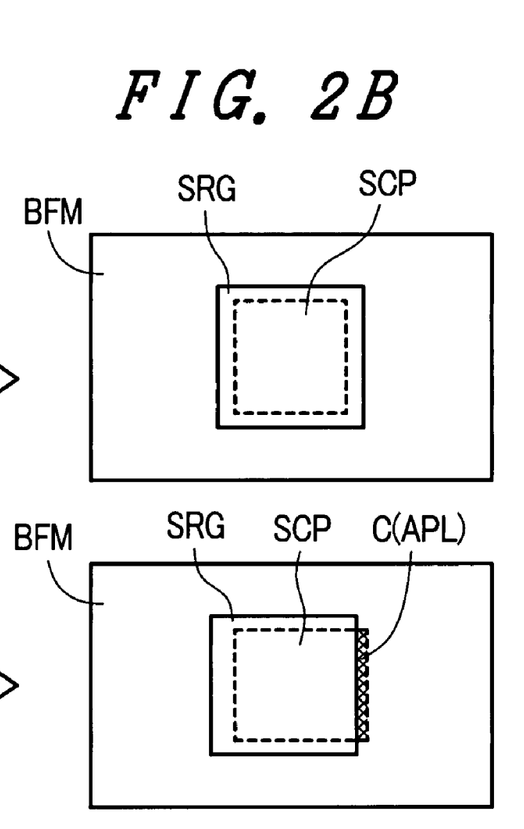

FIGS. 2A and 2B are views illustrating misalignment between an opening of solder resist and a conductive layer in a FPC according to an embodiment 2 of the invention, FIG. 2A being a cross sectional view, and FIG. 2B being a plan view. In FIGS. 2A and 2B, upper sections illustrate the case where there is misalignment less than a predetermined misalignment tolerance between the opening of the solder resist and a misalignment detection pattern SCP, and lower sections illustrate the case where there is misalignment of at least the predetermined misalignment tolerance between the opening of the solder resist SRG and the misalignment detection pattern SCP. Illustration of a wiring pattern is omitted.

According to the present embodiment, the misalignment detection pattern SCP is made island-shaped. As shown in FIGS. 2A and 2B, a conductive layer preferably made of copper (Cu) is used to form an island-shaped misalignment detection pattern SCP on the insulating substrate BFM, and the solder resist SRG is formed on the pattern. A predetermined misalignment tolerance $\Delta S$ is set between an edge SRG of at least a side of the solder resist SRG and an edge of the misalignment detection pattern SCP.

As shown in the upper sections of FIGS. 2A and 2B, when misalignment between the opening of the solder resist SRG and the misalignment detection pattern SCP is less than the predetermined misalignment tolerance $\Delta S$, plating is not formed on the misalignment detection pattern SCP through a gold plating processing in the subsequent process.

In contrast, as shown in the lower sections of FIGS. 2A and 2B, when an amount S of misalignment between the opening of the solder resist SRG and the misalignment detection pattern SCP becomes at least the predetermined misalignment tolerance $\Delta S$, the misalignment detection pattern SCP is exposed from an edge of the solder resist SRG. Therefore, when going through a gold plating processing in the subsequent process, gold plating APL is formed on the misalignment detection pattern SCP exposed from the solder resist SRG. Since there is a large difference in hue and brilliance between a C portion, to which the gold plating APL is applied, and the solder resist SRG in the vicinity thereof, or the substrate BFM, it is possible to visually recognize presence of misalignment between the both and an amount of misalignment with ease. Accordingly, such detection of misalignment can prevent a defective FPC from being used for products, thus enabling obtaining a display device of high quality and high reliability.

Figure 3A:
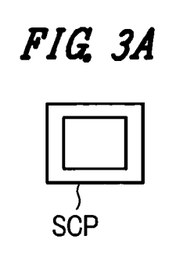
FIGS. 3A to 3F are plan views illustrating various configurational examples of misalignment detection patterns according to the invention.
Figure 3B:
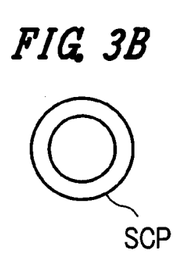
Figure 3C:
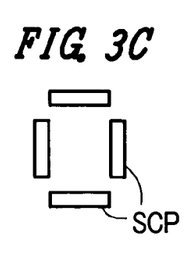
Figure 3D:
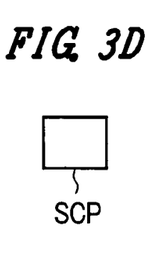
Figure 3E:
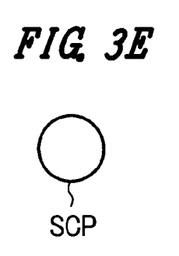
Figure 3F:
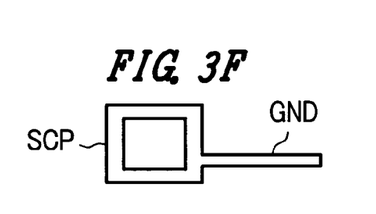

FIGS. 3A to 3F are plan views illustrating various configurational examples of misalignment detection patterns according to the invention. FIG. 3A shows a misalignment detection pattern in the form of the same rectangular frame as that of the detection pattern described in the embodiment 1. FIG. 3B shows a misalignment detection pattern in the form of a ring, FIG. 3C shows a misalignment detection pattern in the form of discrete frames, FIG. 3D shows the same island-shaped misalignment detection pattern as that described in the embodiment 2, and FIG. 3E shows a circular-shaped and island-shaped misalignment detection pattern. Also, FIG. 3F shows an additional configuration for connection of a misalignment detection pattern to a grounding conductor provided on the insulating substrate. In addition, a shape of the misalignment detection pattern is not limited to the above.

It does not matter if a conductive layer (SCP) in the misalignment detection pattern is electrically floating in case of electroless plating. Accordingly, both the embodiment 1 and the embodiment 2 are applicable in case of electroless plating.

In case of electroplating, although not shown, both the embodiment 1 and the embodiment 2 are applicable, for example, when a wiring layer for application of electric potential is formed on a conductive layer (SCP) in the misalignment detection pattern as shown in FIG. 3F. This is because there is a need for application of plating potential in the plating processing. However, the embodiment 1 is suited to electroplating as compared with the embodiment 2 since the former makes it possible to detect misalignment in the opening of the solder resist SRG without being affected by such wiring layer. In addition, when assembled into a display module, it is desirable to supply a predetermined electric potential such as ground potential.

FIG. 4 is a view illustrating an example of a specific arrangement of misalignment detection patterns on a FPC. The FPC includes a mount region EPA of electronic parts centrally thereof, and misalignment detection patterns SCP are formed on both sides of the mount region EPA.

Figure 5:
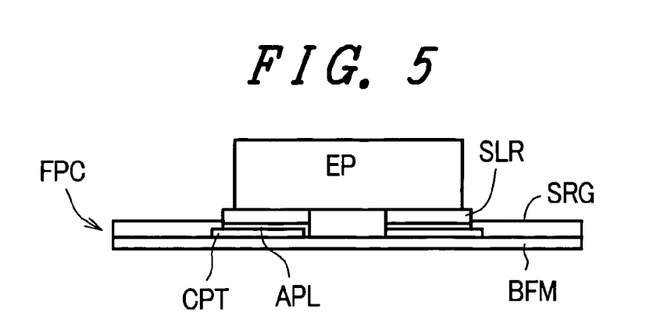
FIG. 5 is a schematic view showing a state, in which an electronic part is mounted on a FPC.

FIG. 5 is a schematic view showing a state, in which an electronic part is mounted on the FPC. The electronic part EP is mounted on the FPC by using solder SLR to connect terminals of the electronic part EP to gold plating APL applied to an electrode CPT of a wiring pattern being a conductive layer formed on an insulating substrate BFM (base film) of the FPC. A major part of the wiring pattern is covered by solder resist SRG as an insulating layer.

Figure 6:
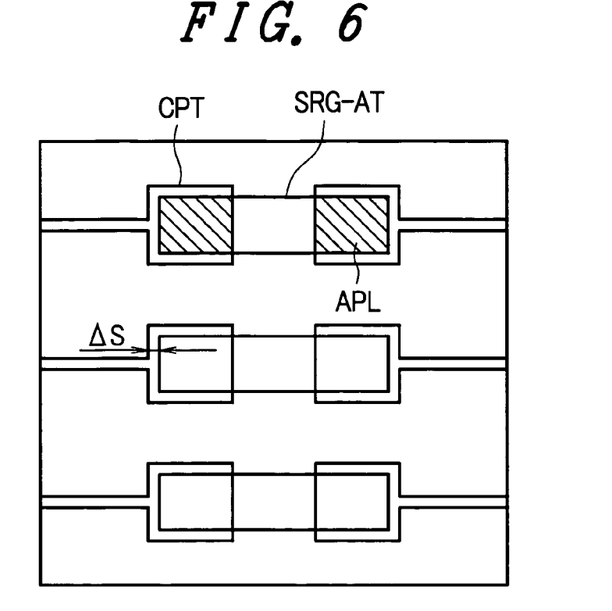
FIG. 6 is a plan view in the case where solder resist openings for wiring terminals, disposed in those portions of a FPC, on which electronic parts are mounted, do not involve misalignment of at least a predetermined misalignment tolerance ΔS.
Figure 7:
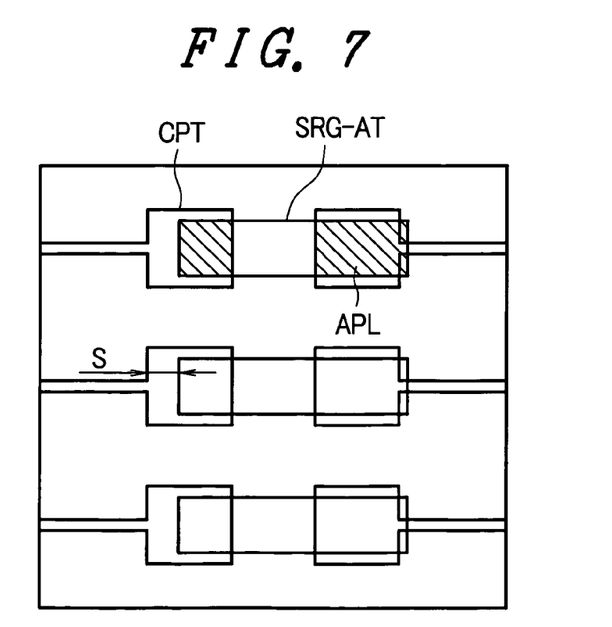
FIG. 7 is a plan view in the case where solder resist openings for wiring terminals, disposed in those portions of a FPC, on which electronic parts are mounted, involve misalignment of at least the predetermined misalignment tolerance ΔS.

FIG. 6 is a plan view in the case where solder resist openings for wiring terminals, disposed in those portions of the FPC, on which the electronic parts are mounted, do not involve misalignment of at least a predetermined misalignment tolerance $\Delta S$, and FIG. 7 is a plan view in the case where solder resist openings for wiring terminals, disposed in those portions of the FPC, on which the electronic parts are mounted, involve misalignment of at least the predetermined misalignment tolerance $\Delta S$. As shown in FIG. 6, when there is no misalignment between conductive layers (wiring terminals) CPT and solder resist openings SRG-AT, gold plating layers APL are formed in sufficient areas on the conductive layers (wiring terminals) CPT. Therefore, the electronic parts are mounted correctly.

In contrast, as shown in FIG. 7, when there is misalignment S, which is at least a predetermined distance $\Delta S$ (misalignment tolerance), between the conductive layers (wiring terminals) CPT and the solder resist openings SRG-AT, the gold plating layers APL are not formed in sufficient areas on the conductive layers (wiring terminals) CPT, so that the electronic parts are mounted unstably.

Figure 8:
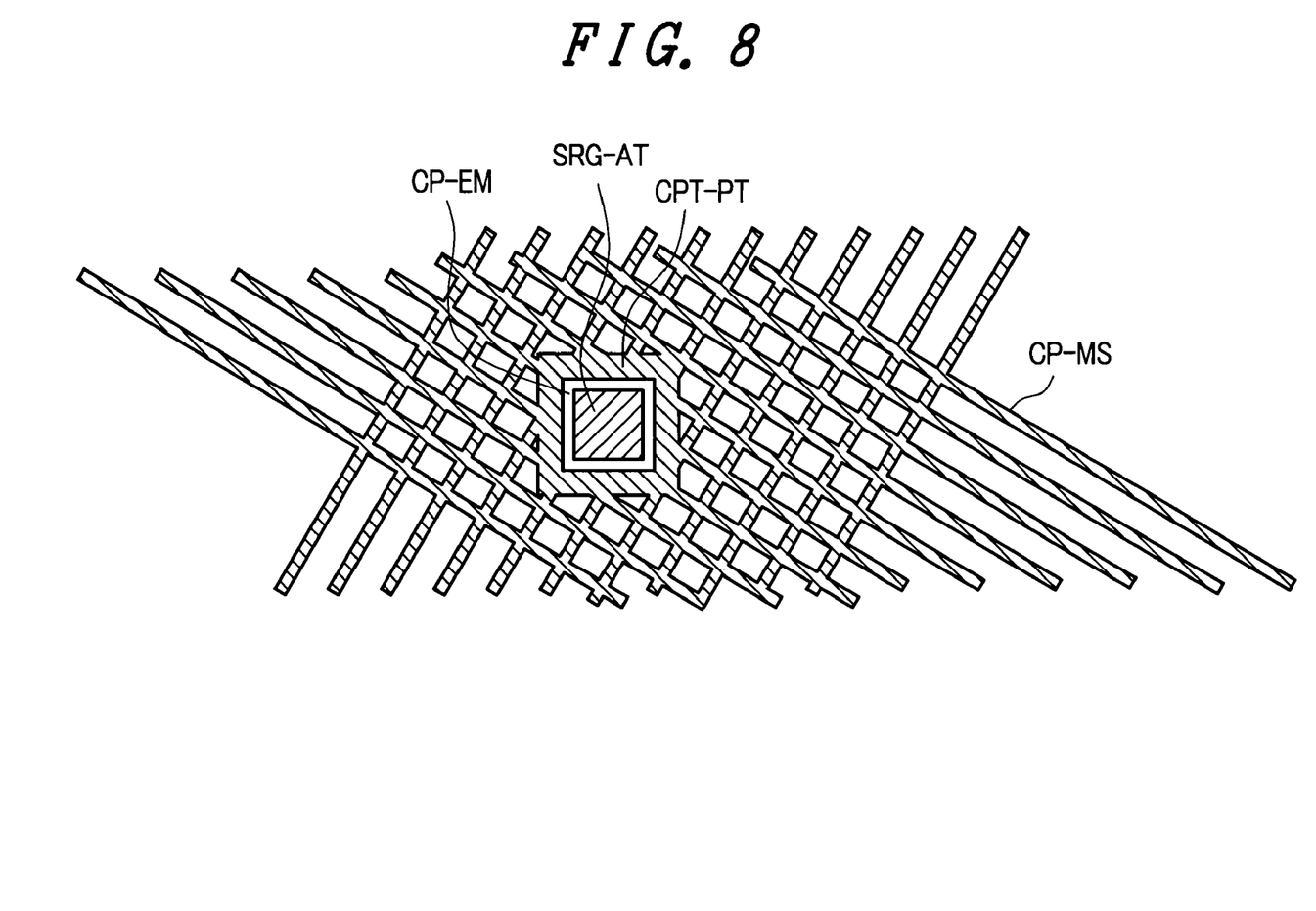
FIG. 8 is a plan view illustrating an actual example of a misalignment detection pattern according to the invention.

FIG. 8 is a plan view illustrating an actual example of a misalignment detection pattern according to the invention. In this example, the misalignment detection pattern of the embodiment 1 illustrated in FIG. 1 is formed in a region of a ground pattern CP-MS provided on a FPC. The ground pattern CP-MS shown in FIG. 8 is meshy, and the misalignment detection pattern is embedded in the meshy ground pattern CP-MS. Accordingly, the misalignment detection pattern is formed by coating or applying solder resist over the whole meshy ground pattern CP-MS to cover a frame-shaped conductive layer CPT-PT, and includes a solder resist opening SRG-AT inside the frame-shaped conductive layer CPT-PT. In addition, the figure shows a state, in which no misalignment is present in the solder resist opening SRG-AT, and a portion CP-EM with no conductive layer is present between the solder resist opening SRG-AT and the frame-shaped conductive layer CPT-PT. In addition, the ground pattern CP-MS is not limited to a meshy one but may be one, in which copper foil or the like is formed wholly. In addition, instead of ground potential, a predetermined potential may be applied to the ground pattern CP-MS. Also, in case of electroless plating, plating potential is applied to the ground pattern CP-MS in a processing of plating.

Figure 9:
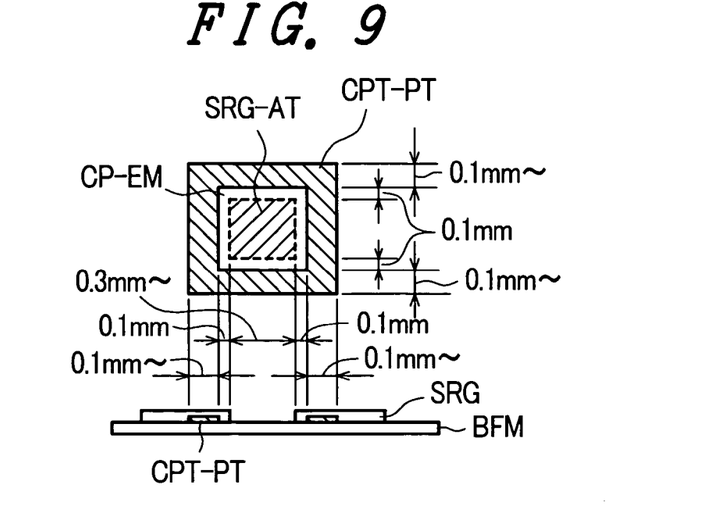
FIG. 9 is a view illustrating a specific example of dimensions of the detection pattern shown in FIG. 8.

FIG. 9 is a view illustrating a specific example of dimensions of the detection pattern shown in FIG. 8. The detection pattern is in the form of a square frame, and a conductive layer CPT-PT thereof has the following dimensions. The frame of the conductive layer CPT-PT has a width of at least 0.1 mm, a side of the solder resist opening SRG-AT has a width of at least 0.3 mm, a width between an inner edge of the solder resist opening SRG-AT, an inner edge of the frame-shaped conductive layer CPT-PT, that is, a width of the portion CP-EM with no conductive layer is 0.1 mm being the misalignment tolerance ΔS, and other dimensions are as shown in the figure.

Figure 10:
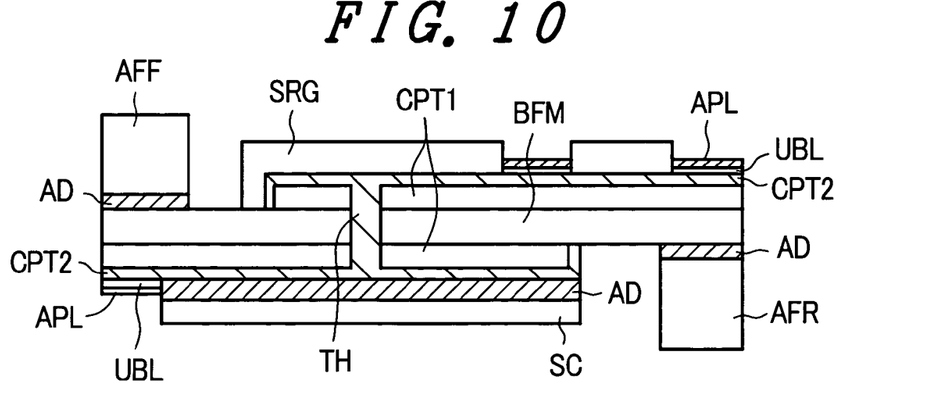
FIG. 10 is a schematic view of a cross section illustrating a constructional example of a FPC, to which the invention is applied.

FIG. 10 is a schematic view of a cross section illustrating a constructional example of a FPC, to which the invention is applied. The FPC is a so-called double-FPC having a two-layered conductive pattern. A conductive layer CPT1 made of electrolytic copper foil is patterned on both surfaces of a base film BFM being an insulating substrate. Electrolytic copper plating PCT2 is applied to an upper layer of the conductive layer CPT1. With the double-FPC, the conductive layer CPT1 and the copper plating PCT2 are laminated to make conductive layers CPT. The reference character SRG denotes solder resist, AD an adhesive, SC a cover film, UBL a nickel backing layer, APL a gold plating layer, and AFF a front-side reinforcement film, AFR a back-side reinforcement film. The front and back conductive layers CPT are connected to each other through a through-hole TH at need.

The FPC is manufactured in the following processes. First, in a pre-process, (1) a through-hole TH is formed in an insulating substrate BFM formed with a non-patterned conductive layer CPT1, and a copper plating PCT2 is applied in order to connect double-conductive layers CPT1 to each other through the through-hole TH. (2) Photosensitive resist film is laminated (stuck), or photosensitive resist is coated, and pattern exposure and etching are performed to form a pattern of the conductive layers CPT. (3) Back-side cover film Sc is laminated and curing is performed in an oven. (4) Subsequently, solder resist SRG is laminated on a surface, on which an electronic part is mounted, exposure and developing are performed to form a necessary opening including a misalignment detection pattern, and curing is performed. (5) Reinforcement films AFF, AFR are adhered to a FPC with the use of an adhesive AD. (6) Nickel plating UBL and gold plating APL are applied in the plating process.

In addition, while according to the embodiment the resist film of photosensitive film type is laminated when the solder resist SRG is formed, this is not limitative but photosensitive liquid resist may be applied. Also, a material for plating in the plating process is not limited to nickel and gold but other materials may be used. The insulating substrate BFM is not limited to polyimide but other materials may be used.

In a post-process, punching for a necessary shape is performed and a process of inspection follows. In the process of inspection, a microscope of about 10 magnifications is used to perform inspection. When misalignment of at least a predetermined amount is present in the inspection, plating adheres to a copper pattern protruding from the solder resist to afford visual inspection of misalignment with ease. In addition, the inspection may be performed before punching as far as it is performed after the plating process.

Figure 11:
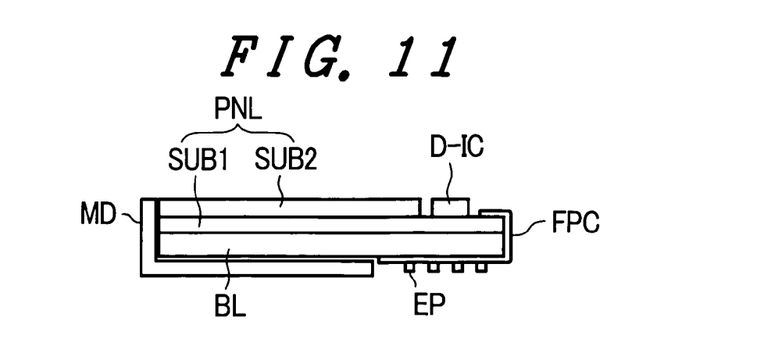
FIG. 11 is a schematic view of a cross section illustrating a liquid crystal module for portable telephones as an example of application of a display device according to the invention.

FIG. 11 is a schematic view of a cross section illustrating a liquid crystal module for portable telephones as an example of application of a display device according to the invention. The liquid crystal module for portable telephones comprises a backlight BL provided on a back surface of a liquid crystal panel PNL having two glass substrates SUB1, SUB2, these elements being accommodated in a mold casing MD to be made unitary. A drive circuit chip (IC chip) D-IC is mounted on one SUB1 of the glass substrates of the liquid crystal panel PNL. A FPC mounting thereon electronic parts EP is connected at one end thereof to the drive circuit chip D-IC and at the other end thereof to a signal processing circuit substrate (not shown) provided on a back surface of the backlight BL.

The invention is not limited to a display device, which makes use of a liquid crystal panel, but is also applicable to a display device, which makes use of other display panels such as organic EL display devices, FED, etc., or other electronic devices.

What is claimed is:

1. A display device comprising a display panel and a circuit substrate connected to the display panel,
   wherein the display panel includes at least one array substrate,
   the circuit substrate is separately formed and positioned different from said array substrate and comprises an insulating substrate, a conductive layer, an insulating layer to cover a part of the conductive layer,
   the conductive layer of the circuit substrate includes a wiring pattern, wiring terminals, and a misalignment detection pattern for detecting the misalignment between the conductive layer and the insulating layer,
   the wiring terminals are exposed from the insulating layer and are applied with a plating layer to a surface exposed from the insulating layer, and
   the misalignment between the conductive layer and the insulating layer is smaller than a predetermined misalignment tolerance, and the misalignment detection pattern comprises a pattern covered by the insulating layer in a manner to prevent adherence of a plating material to the conductive layer.

2. The display device according to claim 1, wherein the misalignment detection pattern comprises an opening formed on the insulating layer to allow the insulating substrate to be exposed, and the conductive layer formed at a predetermined distance from the opening to surround the opening and covered by the insulating layer, if the misalignment between the conductive layer and the insulating layer is smaller than a predetermined misalignment tolerance.

3. The display device according to claim 2, wherein the misalignment detection pattern is unitarily continuous to surround the opening thereof.

4. The display device according to claim 2, wherein the conductive layer surrounding the opening of the misalignment detection pattern comprises a plurality of discrete patterns.

5. The display device according to claim 1, wherein the misalignment detection pattern comprises the conductive layer formed to be island-shaped, and the insulating layer formed to be island-shaped to cover the island-shaped conductive layer.

6. The display device according to claim 1, wherein the misalignment detection pattern is conductive and supplied with a predetermined potential.

7. The display device according to claim 1, wherein the conductive layer of the misalignment detection pattern is electrically floating.

8. The display device according to claim 1, wherein the circuit substrate is a flexible printed circuit substrate.

9. The display device according to claim 1, wherein an electronic part is mounted on one of the wiring terminals of the circuit substrate.

10. The display device according to claim 1, wherein the circuit substrate covers a part of a back surface of the display panel.

11. The display device according to claim 1, wherein the circuit substrate covers a part of a side surface of the display panel.

12. The display device according to claim 1, wherein the display panel is a liquid crystal display panel, and the circuit substrate covers a part of a back surface a backlight of the display panel.

13. The display device according to claim 12, wherein a drive circuit chip is mounted on one array substrate of the liquid crystal display panel, and the circuit substrate is connected at one end thereof to the drive circuit chip and at the other end thereof to another substrate provided on the back surface of the backlight.

14. The display device according to claim 1, wherein the display panel is a liquid crystal display panel, an organic electroluminescence (EL) display panel, a field emission type display (FED) panel, or a plasma display panel.

15. A display device comprising a display panel and a circuit substrate connected to the display panel,
   wherein the display panel includes at least one array substrate,
   the circuit substrate is separately formed and positioned different from said array substrate and comprises an insulating substrate, a conductive layer, an insulating layer to cover a part of the conductive layer,
   the conductive layer of the circuit substrate includes a wiring pattern, wiring terminals, and a misalignment detection pattern for detecting the misalignment between the conductive layer and the insulating layer,
   the wiring terminals are exposed from the insulating layer and are applied with a plating layer to a surface exposed from the insulating layer,
   if the misalignment between the conductive layer and the insulating layer is smaller than a predetermined misalignment tolerance, the misalignment detection pattern comprises a pattern covered by the insulating layer in a manner to prevent adherence of a plating material to the conductive layer, and
   if the misalignment between the conductive layer and the insulating layer is larger than the predetermined misalignment tolerance, a part of the misalignment detection pattern is exposed from the insulating layer in a manner to be applied with plating.

16. The display device according to claim 15, wherein the misalignment detection pattern comprises an opening formed on the insulating layer to allow the insulating substrate to be exposed,
   if the misalignment between the conductive layer and the insulating layer is smaller than a predetermined misalignment tolerance, the conductive layer formed at a predetermined distance from the opening to surround the opening and covered by the insulating layer, and
   if the misalignment between the conductive layer and the insulating layer is larger than the predetermined misalignment tolerance, the conductive layer is exposed from the insulating layer at the opening of the insulating layer.

17. The display device according to claim 16, wherein the conductive layer of the misalignment detection pattern surrounding the opening of the insulating layer is formed as unitarily continuous.

18. The display device according to claim 15, wherein the misalignment detection pattern is conductive and supplied with a predetermined potential.

19. The display device according to claim 15, wherein the circuit substrate is a flexible printed circuit substrate.

20. The display device according to claim 15, wherein an electronic part is mounted on one of the wiring terminals of the circuit substrate.

21. The display device according to claim 15, wherein the circuit substrate covers a part of a back surface of the display panel.

22. The display device according to claim 15, wherein the circuit substrate covers a part of a side surface of the display panel.

23. The display device according to claim 15, wherein the display panel is a liquid crystal display panel, and the circuit substrate covers a part of a back surface a backlight of the display panel.

24. The display device according to claim 23, wherein a drive circuit chip is mounted on one array substrate of the liquid crystal display panel, and the circuit substrate is connected at one end thereof to the drive circuit chip and at the other end thereof to another substrate provided on the back surface of the backlight.

25. The display device according to claim 15, wherein the display panel is a liquid crystal display panel, an organic electroluminescence (EL) display panel, a field emission type display (FED) panel, or a plasma display panel.

* * * * *